(12) United States Patent
Yu et al.

(10) Patent No.: US 6,881,622 B2
(45) Date of Patent: Apr. 19, 2005

(54) AQUEOUS AMMONIUM HYDROXIDE AMORPHOUS SILICON ETCH METHOD FOR FORMING MICROELECTRONIC CAPACITOR STRUCTURE

(75) Inventors: Chi-Hsing Yu, Hsin-Chu (TW); Chih-Yang Pai, Hsin-Chu (TW); Chia-Shiung Tsai, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/159,226

(22) Filed: May 30, 2002

(65) Prior Publication Data
US 2003/0222298 A1 Dec. 4, 2003

(51) Int. Cl.$^7$ .................................... H01L 21/8242
(52) U.S. Cl. ................. 438/253; 438/255; 438/396; 438/398
(58) Field of Search .................. 438/253–255, 438/396–398

(56) References Cited

U.S. PATENT DOCUMENTS

| 5,846,921 | A | * | 12/1998 | Gil et al. ............... 510/175 |
| 5,866,453 | A | | 2/1999 | Prall et al. |
| 6,066,527 | A | * | 5/2000 | Kudelka et al. ......... 438/243 |
| 6,083,849 | A | * | 7/2000 | Ping et al. .............. 438/753 |
| 6,262,450 | B1 | | 7/2001 | Kotecki et al. |

* cited by examiner

Primary Examiner—Thanh Nguyen
(74) Attorney, Agent, or Firm—Tung & Associates

(57) ABSTRACT

Within a method for fabricating a capacitor structure within a microelectronic fabrication there is formed a capacitor structure comprising a pair of capacitor plate layers separated by a capacitor dielectric layer. Within the method, at least one of the pair of capacitor plates is formed of a doped amorphous silicon material formed incident to isotropic etching within an etchant solution comprising aqueous ammonium hydroxide, without hydrogen peroxide.

8 Claims, 2 Drawing Sheets

AQUEOUS AMMONIUM HYDROXIDE AMORPHOUS SILICON ETCH METHOD FOR FORMING MICROELECTRONIC CAPACITOR STRUCTURE

BACKGROUND OF THE INVENTION

1. Field of the Invention

The present invention relates generally to capacitor structures employed within microelectronic fabrications. More particularly, the present invention relates to methods for forming capacitor structures employed within microelectronic fabrications.

2. Description of the Related Art

Semiconductor integrated circuit microelectronic fabrications are formed from semiconductor substrates within and upon which are formed semiconductor devices, and over which are formed patterned conductor layers which are separated by dielectric layers.

Common in the art of semiconductor integrated circuit microelectronic fabrication, and in particular in the art of semiconductor integrated circuit microelectronic memory fabrication, is the use and the fabrication of memory cell structures, and in particular dynamic random access memory (DRAM) cell structures. Dynamic random access memory (DRAM) cell structures typically comprise a field effect transistor (FET) device formed within and upon a semiconductor substrate, where one of a pair of source/drain regions within the field effect transistor (FET) device has formed thereover and electrically connected therewith a storage capacitor. Within a dynamic random access memory (DRAM) cell structure, a gate electrode of the field effect transistor (FET) device serves as a wordline which provides a switching function for charge introduction into and retrieval from the storage capacitor, while the other of the pair of source/drain regions within the field effect transistor (FET) device serves as a contact for a bitline conductor stud which introduces or retrieves charge with respect to the storage capacitor.

While the dynamic random access memory (DRAM) cell structure has clearly become ubiquitous in the art of semiconductor integrated circuit microelectronic memory fabrication, and is thus essential in the art of semiconductor integrated circuit microelectronic fabrication, the dynamic random access memory (DRAM) cell structure is nonetheless not entirely without problems in the art of semiconductor integrated circuit microelectronic fabrication.

In that regard, as semiconductor integration levels have increased and semiconductor device and patterned conductor layer dimensions have decreased, it has become increasingly common in the art of semiconductor integrated circuit microelectronic fabrication, and in particular in the art of semiconductor integrated circuit microelectronic memory fabrication, to readily form dynamic random access memory (DRAM) cell structures with enhanced performance.

It is thus desirable in the art of semiconductor integrated circuit microelectronic fabrication, and in particular in the art of semiconductor integrated circuit microelectronic memory fabrication, to provide methods and materials through which there may be readily formed, with enhanced performance, dynamic random access memory (DRAM) cell structures.

It is towards the foregoing object that the present invention is directed.

Various methods have been disclosed in the art of semiconductor integrated circuit microelectronic fabrication for forming, with desirable properties, dynamic random access memory (DRAM) cell structures.

Included among the methods, but not limited among the methods, are methods disclosed within: (1) Prall et al., in U.S. Pat. No. 5,866,453 (a sequential anisotropic etch method and isotropic etch method for forming, with enhanced photolithographic registration tolerance, a bitline stud layer within a capacitor under bitline dynamic random access memory (DRAM) cell structure); and (2) Kotecki et al., in U.S. Pat. No. 6,262,450 (a damascene method for forming, with enhanced efficiency, an at least partially borderless capacitor contact via within a capacitor over bitline dynamic random access memory (DRAM) cell structure).

Desirable in the art of semiconductor integrated circuit microelectronic fabrication, and in particular in the art of semiconductor integrated circuit microelectronic memory fabrication, are additional methods and materials which may be employed for readily forming, with enhanced performance, dynamic random access memory (DRAM) cell structures.

It is towards the foregoing object that the present invention is directed.

SUMMARY OF THE INVENTION

A first object of the invention is to provide a method for forming a dynamic random access memory (DRAM) cell structure within a semiconductor integrated circuit microelectronic fabrication.

A second object of the present invention is to provide a method in accord with the first object of the present invention, wherein the dynamic random access memory (DRAM) cell structure is readily formed with enhanced performance.

A third object of the present invention is to provide a method in accord with the first object of the present invention and the second object of the present invention, wherein the method is readily commercially implemented.

In accord with the objects of the present invention, there is provided by the present invention a method for fabricating a capacitor structure within a microelectronic fabrication, as well as the capacitor structure fabricated within the microelectronic fabrication while employing the method.

To practice the method of the present invention, there is first provided a substrate. There is then formed over the substrate a first capacitor plate layer. There is then formed upon the first capacitor plate layer a capacitor dielectric layer. There is then formed upon the capacitor dielectric layer a second capacitor plate layer. Within the present invention, at least one of the first capacitor plate layer and the second capacitor plate layer is formed of a doped amorphous silicon material. Similarly, within the method of the present invention, the at least one of the first capacitor plate layer and the second capacitor plate layer which is formed of the doped amorphous silicon material is formed incident to isotropic etching within an etchant solution comprising aqueous ammonium hydroxide, without hydrogen peroxide.

The method for forming the capacitor structure in accord with the present invention contemplates a capacitor structure formed in accord with the method for forming the capacitor structure in accord with the present invention.

The present invention provides a method for forming a dynamic random access memory (DRAM) cell structure within a semiconductor integrated circuit microelectronic fabrication, wherein the dynamic random access memory (DRAM) cell structure is readily formed with enhanced performance.

The present invention realizes the foregoing objects by forming a capacitor structure, which may be employed within a dynamic random access memory (DRAM) cell structure, with at least one of a first capacitor plate layer and a second capacitor plate layer formed of a doped amorphous silicon material formed incident to isotropic etching within an etchant solution comprising aqueous ammonium hydroxide, without hydrogen peroxide. Within the context of the present invention, the foregoing materials compositions for forming the capacitor structure provide a particularly efficient method for fabricating the capacitor structure within a microelectronic fabrication, which in particular may be a storage capacitor structure within a dynamic random access memory (DRAM) cell structure.

The method of the present invention is readily commercially implemented.

The present invention employs methods and materials as are generally known in the art of semiconductor integrated circuit microelectronic fabrication, but employed within the context of specific process orderings and specific materials limitations to provide the method of the present invention. Since it is thus at least in part specific process orderings and specific materials limitations which provide at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The present invention provides a method for forming a dynamic random access memory (DRAM) cell structure within a semiconductor integrated circuit microelectronic fabrication, wherein the dynamic random access memory (DRAM) cell structure is readily formed with enhanced performance.

The present invention realizes the foregoing objects by forming a capacitor structure which may be employed within a dynamic random access memory (DRAM) cell structure with at least one of a first capacitor plate layer and a second capacitor plate layer formed of a doped amorphous silicon material formed incident to isotropic etching within an etchant solution comprising aqueous ammonium hydroxide, without hydrogen peroxide. Within the context of the present invention, the foregoing materials compositions for forming the capacitor structure provide a particularly efficient method for fabricating the capacitor structure within a microelectronic fabrication, which in particular may be a storage capacitor structure within a dynamic random access memory (DRAM) cell structure.

Although the preferred embodiment of the present invention illustrates the present invention most particularly within the context of forming an upper capacitor plate layer within a capacitor structure within a capacitor under bitline (CUB) dynamic random access memory (DRAM) cell structure, the present invention may nonetheless be employed for forming upper or lower capacitor plate layers within capacitor structures within various types of microelectronic fabrications. In that regard, the present invention may be employed for forming upper or lower capacitor plate layers within capacitor structures within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 4, there is shown a series of schematic cross-sectional diagrams illustrating the results of progressive stages in forming, in accord with a preferred embodiment of the present invention, a dynamic random access memory (DRAM) cell structure within a semiconductor integrated circuit microelectronic fabrication.

Figure 1:
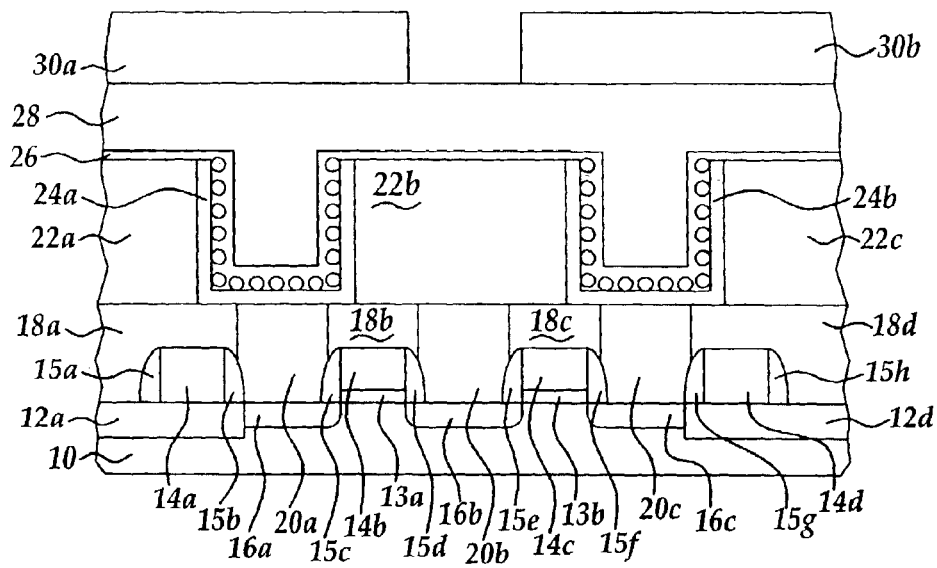
FIG. 1, FIG. 2, FIG. 3 and FIG. 4 show a series of schematic cross-sectional diagrams illustrating the results of progressive stages in forming, in accord with a preferred embodiment of the present invention, a dynamic random access memory (DRAM) cell structure within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown within FIG. 1, in a first instance, is a semiconductor substrate 10 having formed therein a pair of isolation regions 12a and 12b.

Within the preferred embodiment of the present invention with respect to the semiconductor substrate 10, and although semiconductor substrates are known in the art of semiconductor integrated circuit microelectronic fabrication with either dopant polarity, several dopant concentrations and various crystallographic orientations, for the preferred embodiment of the present invention, the semiconductor substrate 10 is typically and preferably a (100) silicon semiconductor substrate having at least either N- or P-doped regions.

Similarly, within the preferred embodiment of the present invention with respect to the pair of isolation regions 12a and 12b, and although it is also known in the art of semiconductor integrated circuit microelectronic fabrication that isolation regions may be formed employing methods including but not limited to isolation region thermal growth methods and isolation region deposition/patterning methods, for the preferred embodiment of the present invention, the isolation regions 12a and 12b are, as is illustrated within the schematic cross-sectional diagram of FIG. 1, formed as shallow trench isolation (STI) regions formed at least in part of a silicon oxide material formed within the semiconductor substrate 10.

Shown also within the schematic cross-sectional diagram of FIG. 1, and formed upon the active region of the semiconductor substrate as defined by the pair of isolation regions 12a and 12b, is a pair of field effect transistor (FET) devices comprising: (1) a pair of gate dielectric layers 13a and 13b formed upon the active region of the semiconductor substrate 10; (2) a pair of gate electrodes 14b and 14c formed aligned upon the pair of gate dielectric layers 13a and 13b; (3) a series of spacer layers 15c, 15d, 15e and 15f formed adjoining a pair of opposite edges of the pair of gate dielectric layers 13a and 13b and the pair of gate electrodes 14b and 14c; and (4) a series of source/drain regions 16a, 16b and 16c formed within the active region of the semiconductor substrate and separated by the pair of gate electrodes 14b and 14c. Similarly, there is also shown within the schematic cross-sectional diagram of FIG. 1 a pair of interconnect structures which comprises: (1) a pair of interconnect layers 14a and 14d formed upon the corresponding isolation regions 12a and 12b; and (2) a series of spacer layers 15a, 15b, 15g and 15h formed adjacent a series of sidewalls of the pair of interconnect layers 14a and 14b.

Within the preferred embodiment of the present invention with respect to each of the foregoing series of structures which comprises the pair of field effect transistor (FET) devices and the pair of interconnect structures, each of the foregoing series of structures which comprises the pair of field effect transistor (FET) devices and the pair of interconnect structures may be formed employing methods and materials as are conventional in the art of semiconductor integrated circuit microelectronic fabrication.

For example, and without limitation, the pair of gate dielectric layers 13a and 13b is typically and preferably, although not exclusively, formed of a silicon oxide gate dielectric material thermally grown upon the active region of the semiconductor to a thickness of from about 60 to about 80 angstroms. In addition, and also for example, and also without limitation, the pair of gate electrodes 14b and 14c, as well as the pair of interconnect layers 14a and 14d, are typically and preferably, but not exclusively, formed of a gate electrode material such as but not limited to a metal, metal alloy, doped polysilicon (having a dopant concentration of greater than about 5E20 dopant atoms per cubic centimeter) or polycide (doped polysilicon/metal silicide stack) gate electrode material, formed to a thickness of from about 1300 to about 2300 angstroms (although doped polysilicon and polycide gate electrode materials are typically preferred). Further, and also for example, and also without limitation, the series of spacer layers 15a, 15b, 15c, 15d, 15e, 15f, 15g and 15h is typically and preferably formed of a dielectric spacer material, such as but not limited to a silicon nitride dielectric spacer material or a silicon oxynitride dielectric spacer material, formed in a spacer shape while employing an anisotropic etching method. Finally, and also for example, and also without limitation, the series of source/drain regions 16a, 16b and 16c is typically and preferably formed employing an ion implantation method which employs the pair of gate electrodes 14b and 14c as a mask.

Shown also within the schematic cross-sectional diagram of FIG. 1, and formed passivating the pair of field effect transistor (FET) devices and the pair of interconnect structures, is a series of patterned planarized pre-metal dielectric (PMD) layers 18a, 18b, 18c and 18d which defines a series of three first apertures within which is formed a series of three conductive landing studs 20a, 20b and 20c.

Within the preferred embodiment of the present invention with respect to the series of patterned planarized pre-metal dielectric layers 18a, 18b, 18c and 18d, the series of patterned planarized pre-metal dielectric layers 18a, 18b, 18c and 18d is typically and preferably formed of a silicon oxide dielectric material layer deposited employing an ozone assisted thermal chemical vapor deposition (CVD) method, formed and planarized to a thickness of from about 5000 to about 8000 angstroms passivating the pair of field effect transistor (FET) devices and the pair of interconnect structures. The planarized silicon oxide dielectric material layer is then patterned to form the series of three first apertures which accesses the series of source/drain regions 16a, 16b and 16c.

Similarly, once having formed the series of patterned planarized pre-metal dielectric (PMD) layers 18a, 18b, 18c and 18d, the series of conductive landing studs 20a, 20b and 20c is typically and preferably formed within the series of three first apertures defined by the series of patterned planarized pre-metal dielectric (PMD) layers 18a, 18b, 18c and 18d, while employing a blanket deposition and chemical mechanical polish (CMP) planarizing method. Although the series of conductive landing studs 20a, 20b and 20c may be formed from any of several conductor materials, including but not limited to metal, metal alloy, doped polysilicon and polycide conductor materials, for the preferred embodiment of the present invention, the series of conductive landing studs 20a, 20b and 20c is typically and preferably formed of a doped polysilicon conductor material.

Shown also within the schematic cross-sectional diagram of FIG. 1, and formed upon the series of patterned planarized pre-metal dielectric (PMD) layers 18a, 18b, 18c and 18d, is a series of capacitor node dielectric layers 22a, 22b and 22c which defines a pair of second apertures which leaves exposed upper portions of the pair of conductive landing studs 20a and 20c. Similarly, there is also shown within the schematic cross-sectional diagram of FIG. 1, and formed conformally within the pair of second apertures defined by the series of capacitor node dielectric layers 22a, 22b and 22c, a pair of patterned conformal first capacitor plate layers 24a and 24b.

Within the first preferred embodiment of the present invention with respect to the series of capacitor node dielectric layers 22a, 22b and 22c, the series of capacitor node dielectric layers 22a, 22b and 22c is typically formed of a dielectric material generally analogous to the dielectric material from which is formed the series of patterned planarized pre-metal dielectric (PMD) layers 18a, 18b, 18c and 18d, but with an etch specificity with respect to the dielectric material from which is formed the series of patterned planarized pre-metal dielectric (PMD) layers 18a, 18b, 18c and 18d. Typically and preferably, under circumstances where the series of patterned planarized pre-metal dielectric (PMD) layers 18a, 18b, 18c and 18d is formed of a silicon oxide dielectric material deposited employing an ozone assisted thermal chemical vapor deposition (CVD) method, the series of capacitor node dielectric layers 22a, 22b and 22c is formed of a dense silicon oxide dielectric material formed employing a plasma enhanced chemical vapor deposition (PECVD) method. Similarly, within the preferred embodiment of the present invention with respect to the pair of patterned conformal first capacitor plate layers 24a and 24b, and although other methods and materials may be employed in forming the pair of patterned conformal first capacitor plate layers 24a and 24b, the pair of patterned conformal first capacitor plate layers 24a and 24b is typically and preferably formed of a doped polysilicon material, typically and preferably also formed, as is illustrated within the schematic cross-sectional diagram of FIG. 1, with a hemispherical surface grain, in order to provide enhanced surface area of the pair of patterned conformal first capacitor plate layers 24a and 24b, which serve as a pair of capacitor node layers.

As is understood by a person skilled in the art, in order to form the series of capacitor node dielectric layers 22a, 22b and 22c as illustrated within the schematic cross-sectional diagram of FIG. 1, along with the pair of patterned conformal first capacitor plate layers 24a and 24b as illustrated within the schematic cross-sectional diagram of FIG. 1, there is first formed a blanket capacitor node dielectric layer which is patterned to form the series of patterned capacitor node dielectric layers 22a, 22b and 22c which defines the pair of second apertures which expose upper portions of the pair of conductive landing studs 20a and 20c. There is then formed conformally upon exposed surfaces of the series of patterned capacitor node dielectric layers 22a, 22b and 22c, and contacting the pair of conductive landing studs 20a and 20c a blanket conformal first capacitor plate layer which is subsequently chemical mechanical polish (CMP) planarized to form the pair of patterned conformal first capacitor plate layers 24a and 24b.

Typically and preferably, each of the series of capacitor node dielectric layers 22a, 22b and 22c is formed to a thickness of from about 2000 to about 12000 angstroms. Typically and preferably, each of the pair of patterned conformal first capacitor plate layers 24a and 24b is formed to a thickness of from about 500 to about 800 angstroms.

Finally, there is also illustrated within the schematic cross-sectional diagram of FIG. 1, and formed upon exposed portions of the series of capacitor node dielectric (IMD) layers 22a, 22b and 22c, and the pair of patterned conformal first capacitor plate layers 24a and 24b, a pair of blanket layers comprising: (1) a blanket capacitor dielectric layer 26, in turn having formed thereupon; (2) a blanket second capacitor plate layer 28. Finally, there is also shown within the schematic cross-sectional diagram of FIG. 1, and formed upon the blanket second capacitor plate layer 28, a pair of patterned photoresist layers 30a and 30b.

Within the preferred embodiment of the present invention with respect to the blanket capacitor dielectric layer 26, the blanket capacitor dielectric layer 26 is typically and preferably formed as a laminate of silicon oxide and silicon nitride dielectric materials, formed to a thickness of from about 40 to about 100 angstroms.

Within the preferred embodiment of the present invention with respect to the blanket second capacitor plate layer 28, the blanket second capacitor plate layer 28 is formed of a doped amorphous silicon material, formed to a thickness of from about 500 to about 2000 angstroms upon the blanket capacitor dielectric layer 26. Typically and preferably, the doped amorphous silicon material is formed employing a chemical vapor deposition (CVD) method while employing silane as a silicon source material, in conjunction with an appropriate dopant source material, to provide a dopant concentration of from about 5E20 to about 15E20 dopant atoms per cubic centimeter within the doped amorphous silicon material.

Typically and preferably, the chemical vapor deposition (CVD) method also employs: (1) a reactor chamber pressure of from about 0.5 to about 1.0 torr; (2) no radio frequency source or bias power; (3) a semiconductor substrate 10 (and overlying layer) temperature of from about 500 to about 560 degrees centigrade; (4) a silane silicon source material flow rate of from about 1000 to about 1500 standard cubic centimeters per minute (sccm); and (5) a dopant source material flow rate of from about 100 to about 500 standard cubic centimeters per minute (sccm).

Within the preferred embodiment of the present invention with respect to the pair of patterned photoresist layers 30a and 30b, the pair of patterned photoresist layers 30a and 30b may be formed of photoresist materials as are otherwise generally conventional in the art of semiconductor integrated circuit microelectronic fabrication, including but not limited to positive photoresist materials and negative photoresist materials. Typically and preferably, each of the pair of patterned photoresist layers 30a and 30b is formed to a thickness of from about 5000 to about 10000 angstroms, to define an opening of linewidth from about 0.5 to about 2 microns.

Figure 2:
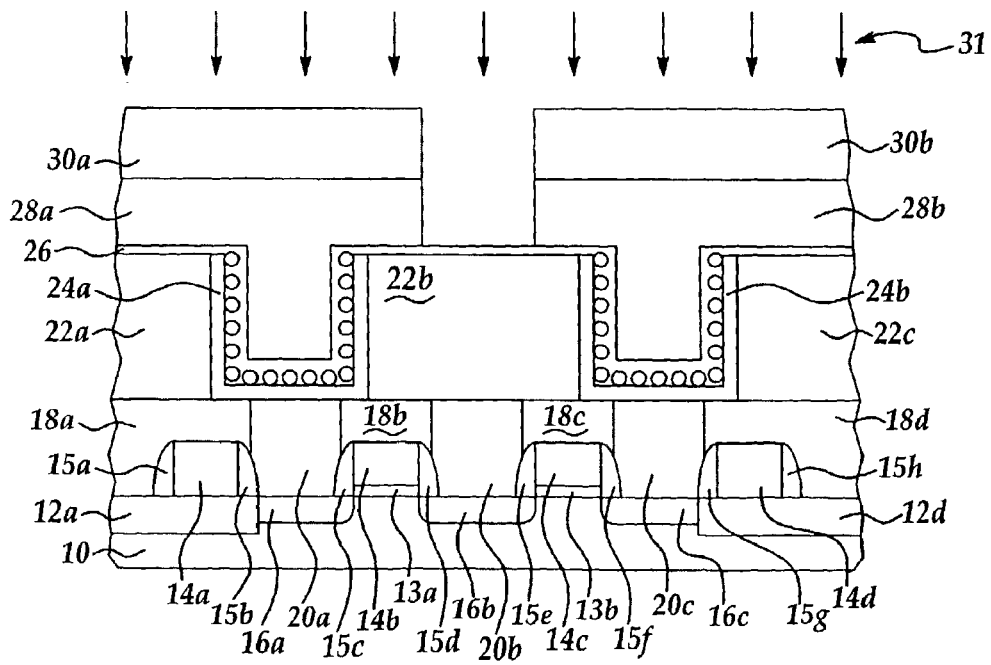

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the blanket second capacitor plate layer 28 has been patterned to form a pair of patterned second capacitor plate layers 28a and 28b, while employing the pair of patterned photoresist layers 30a and 30b as an etch mask layer, in conjunction with an etching plasma 31.

Within the preferred embodiment of the present invention, the etching plasma 31 may be formed employing methods and materials as are otherwise generally conventional in the art of semiconductor integrated circuit microelectronic fabrication, and will generally employ a chlorine containing etchant gas composition to anisotropically etch the blanket second capacitor plate layer 28 when forming therefrom the pair of patterned second capacitor plate layers 28a and 28b.

Figure 3:
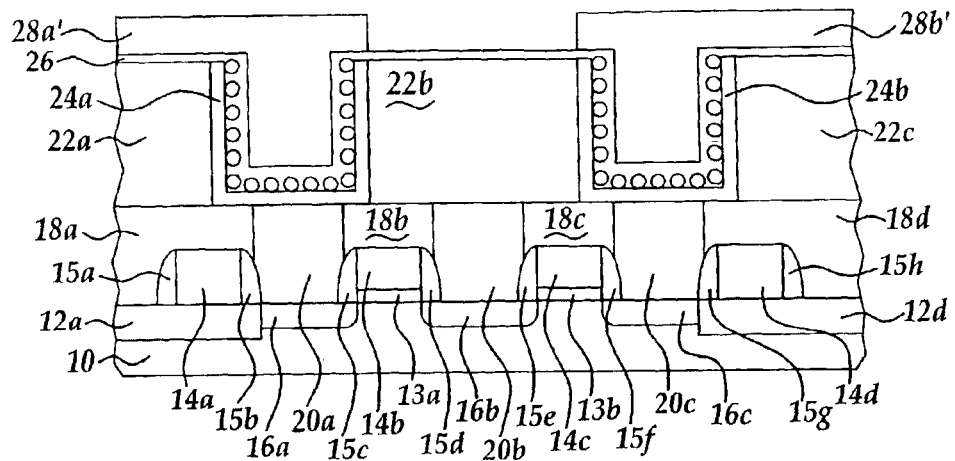

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, the pair of patterned photoresist layers 30a and 30b has been stripped from the pair of patterned second capacitor plate layers 28a and 28b.

Within the preferred embodiment of the present invention, the pair of patterned photoresist layers 30a and 30b may be stripped from the pair of patterned second capacitor plate layers 28a and 28b while employing photoresist stripping methods as are otherwise generally conventional in the art of semiconductor integrated circuit microelectronic fabrication.

Shown also within the schematic cross-sectional diagram of FIG. 3 is the results of isotropically etching the pair of patterned second capacitor plate layers 28a and 28b to form a pair of etched back patterned second capacitor plate layers 28a' and 28b'.

Within the present invention and the preferred embodiment of the present invention when the pair of patterned second capacitor plate layers 28a and 28b is formed of the doped amorphous silicon material, it has been found experimentally within the context of the present invention that the pair of patterned second capacitor plate layers 28a and 28b may be particularly efficiently isotropically etched back to provide the pair of etched back patterned second capacitor plate layers 28a' and 28b' while employing an etchant solution comprising aqueous ammonium hydroxide, absent hydrogen peroxide, or in the alternative an etchant solution consisting essentially of aqueous ammonium hydroxide. Typically and preferably, the etchant solution has an ammonium hydroxide:water weight ratio of from about 1:50 to about 1:200 and more preferably from about 1:70 to about 1:120. Typically and preferably, the etchant solution is employed at a temperature of from about 30 to about 80 degrees centigrade, more preferably at a temperature of from about 40 to about 50 degrees centigrade.

Within the preferred embodiment of the present invention, each of the pair of patterned second capacitor plate layers 28a and 28b is etched back to provide the pair of etched back patterned second capacitor plate layers 28a' and 28b' to an extent such as to optimize registration tolerance when subsequently forming a bitline stud layer interposed between the pair of etched back patterned second capacitor plate layers 28a' and 28b' within the semiconductor integrated circuit fabrication whose schematic cross-sectional diagram is illustrated in FIG. 3. Such etch back thus incidentally also provides for enhanced performance of the semiconductor integrated circuit microelectronic fabrication. Typically and preferably, the etch back will reduce the thickness of each of the pair of etched back patterned second capacitor plate layers 28a' and 28b' by about 500 to about 1500 angstroms, and the their corresponding linewidths by about twice that amount.

As is understood by a person skilled in the art, although the preferred embodiment of the present invention illustrates the present invention within the context of an unmasked isotropic etching of the pair of patterned second capacitor plate layers 28a and 28b to form therefrom the pair of etched back patterned second capacitor plate layers 28a' and 28b' as illustrated within the schematic cross-sectional diagram of FIG. 2, the present invention also contemplates a masked isotropic etching incident to further processing of the semiconductor integrated circuit microelectronic fabrication whose schematic cross-sectional diagram is illustrated in FIG. 2 to provide only a lateral etchback beneath the pair of patterned photoresist layers 30a and 30b to the pair of phantom lines within the pair of patterned second capacitor plate layers 28a and 28b, as illustrated within the schematic cross-sectional diagram of FIG. 2.

Figure 4:
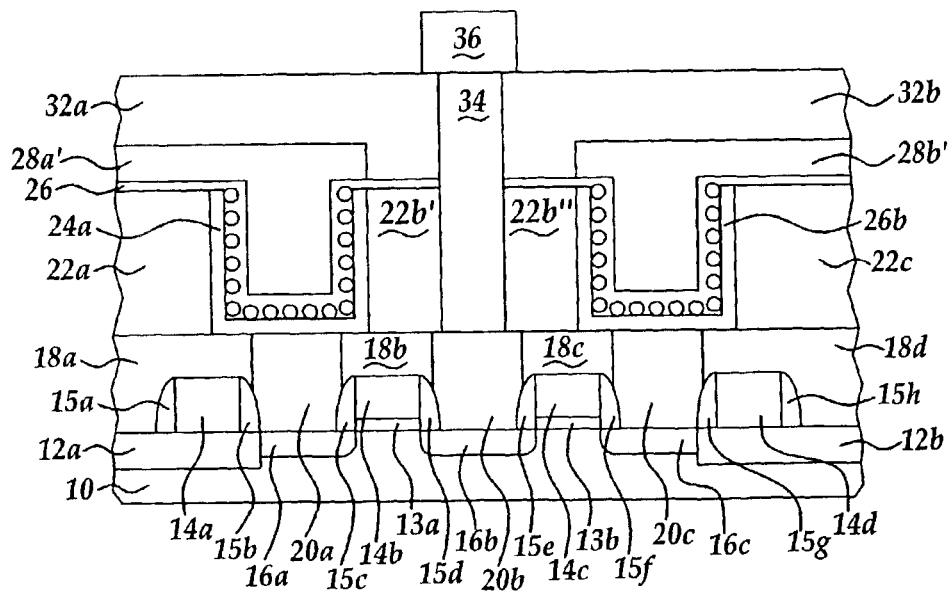

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, there is formed upon exposed portions of the etched back patterned second capacitor plate layers 28a' and 28b' and the blanket capacitor dielectric layer 26 a blanket capacitor passivation dielectric layer from which is eventually formed a pair of patterned capacitor passivation dielectric layers 32a and 32b.

Within the preferred embodiment of the present invention, the blanket capacitor passivation dielectric layer may be formed of dielectric materials as are conventional in the art of semiconductor integrated circuit microelectronic fabrication. Typically and preferably, the blanket capacitor passivation dielectric layer is formed to a thickness of from about 1500 to about 4000 angstroms.

There is also shown within the schematic cross-sectional diagram of FIG. 4 the results of sequentially patterning: (1) the blanket capacitor passivation dielectric layer; (2) the blanket capacitor dielectric layer 26; and (3) the patterned capacitor node dielectric layer 22b, to form: (1) the pair of patterned capacitor passivation dielectric layers 32a and 32b; (2) a pair of patterned capacitor dielectric layers 26a and 26b; and (3) a pair of twice patterned capacitor node dielectric layers 22b' and 22b", which in an aggregate define a third aperture which accesses the conductive landing stud 20b.

Within the preferred embodiment of the present invention, the foregoing patterning may be undertaken employing methods and materials as are conventional in the art of semiconductor integrated circuit microelectronic fabrication, and will typically and preferably include reactive ion etch (RIE) plasma etch methods.

Finally, there is shown within the schematic cross-sectional diagram of FIG. 4, and formed within the third aperture, a bitline stud layer 34 in turn having formed thereupon a patterned first conductor layer 36 which spans over the pair of patterned capacitor passivation dielectric layers 32a and 32b.

Within the preferred embodiment of the present invention, the bitline stud layer 34 and the patterned first conductor layer 36, may be formed employing methods and materials as are otherwise generally conventional in the art of semiconductor integrated circuit microelectronic fabrication.

Upon forming the semiconductor integrated circuit fabrication whose schematic cross-sectional diagram is illustrated in FIG. 8, there is formed a semiconductor integrated circuit fabrication having readily formed therein a dynamic random access memory (DRAM) cell structure in turn having formed therein a capacitor structure, with enhanced performance. The preferred embodiment of the present invention realizes the foregoing object by forming the capacitor structure with at least one capacitor plate layer formed of a doped amorphous silicon material formed incident to etching within an etchant solution comprising aqueous ammonium hydroxide, without hydrogen peroxide. Within the context of the preferred embodiment of the present invention, the foregoing materials compositions provide for enhanced registration flexibility when forming a bitline stud layer within the dynamic random access memory (DRAM) cell structure.

EXAMPLES

In order to illustrate the value of the present invention, there was provided a series of semiconductor substrates having formed thereover either: (1) a weight percent phosphorus doped amorphous silicon layer formed to a thickness of about 2000 angstroms, in accord with the preferred embodiment of the present invention; (2) a 3 weight percent boron and 3 weight percent phosphorus borophosphosilicate glass (BPSG) layer formed to a thickness of about 3000 angstroms; or (3) an undoped silicate glass layer formed to a thickness of about 1000 angstroms, and formed employing a plasma enhanced chemical vapor deposition (PECVD) method employing tetraethylorthosilicate (TEOS) as a silicon source material.

A first series of three substrates representing the foregoing three materials was etched in an aqueous ammonium hydroxide and hydrogen peroxide solution having a water:ammonia:hydrogen peroxide weight ratio of about 80:5:0.8 and a temperature of about 75 degrees centigrade, for a time period of about 1700 seconds. Material layer losses were: (1) 950 angstroms for the doped amorphous silicon; (2) 1560 angstroms for the borophosphosilicate glass (BPSG) glass; and (3) 210 angstroms for the undoped silicate glass (USG), thus providing a Si:BPSG:USG etch rate ratio of 1.0:1.6:0.2.

For comparison purposes, a second series of three substrates representing the foregoing three materials was etched in a 1.5 weight percent aqueous ammonium hydroxide solution, absent hydrogen peroxide, at a temperature of about 45 degrees centigrade, for a time period of about 670 seconds. Material layer losses were: (1) 990 angstroms for the amorphous silicon; (2) 20 angstroms for the borophosphosilicate glass (BPSG) glass; and (3) 12 angstroms for the undoped silicate glass (USG), thus providing a considerably enhanced Si:BPSG:USG etch rate ratio of 1.00:0.02:0.01 which assures that a doped amorphous silicon capacitor plate layer in accord with the present invention may be effectively etched without damaging adjacent layers formed of generally conventional dielectric materials.

To further illustrate the value of the present invention, a pair of capacitor structures was fabricated in accord with the present invention employing: (1) a doped polysilicon first capacitor plate; (2) a silicon oxide/silicon nitride laminated capacitor dielectric layer; and (3) a doped amorphous silicon second capacitor plate layer, each in accord with the preferred embodiment of the present invention. Within one of the pair of capacitor structures, the laminated capacitor dielectric layer was treated with a 1.5 percent aqueous ammonium hydroxide solution, without hydrogen peroxide, at a temperature of about 45 degrees centigrade for a time period of about 11 minutes (and subsequently dried) prior to forming thereupon the second capacitor plate layer.

There was then measured leakage currents and critical voltages for the pair of capacitor structures. For the ammonium hydroxide treated capacitor structure the leakage current was 3.0 E-10+/−1.5 E-10 amps and the critical voltage was 3.05+/−0.05 volts, and for the untreated capacitor structure the leakage current was 2.5 E-10+/−1.5 E-10 amps and the critical voltage was −3.0+/−0.1 volts. Thus, there is no discernable compromise of capacitor structure performance incident to exposure to an etchant solution in accord with the present invention.

As is understood by a person skilled in the art, the preferred embodiment and examples of the present invention are illustrative of the present invention rather than limiting of the present invention. Revisions and modifications may be made to methods, materials, structures and dimensions through which is provided a semiconductor integrated circuit microelectronic fabrication in accord with the preferred embodiment and examples of the present invention, while still providing a method and a microelectronic fabrication in accord with the present invention, further in accord with the accompanying claims.

What is claimed is:

1. A method for fabricating a capacitor structure comprising:
   providing a substrate;
   forming over the substrate a first capacitor plate layer;
   forming upon the first capacitor plate layer a capacitor dielectric layer; and
   forming upon the capacitor dielectric layer a second capacitor plate layer, wherein:
   at least one of the first capacitor plate layer and the second capacitor plate layer is formed of a doped amorphous silicon material, where the doped amorphous silicon material is etched within an etchant solution comprising aqueous ammonium hydroxide, without hydrogen peroxide.

2. The method of claim 1 wherein the capacitor structure is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the at least one of the first capacitor plate layer and the second capacitor plate layer is masked when it is formed incident to isotropic etching within the etchant solution comprising aqueous ammonium hydroxide, without hydrogen peroxide.

4. The method of claim 1 wherein the at least one of the first capacitor plate layer and the second capacitor plate layer is unmasked when it is formed incident to isotropic etching within the etchant solution comprising aqueous ammonium hydroxide, without hydrogen peroxide.

5. A method for fabricating a capacitor structure comprising:
   providing a substrate;
   forming over the substrate a first capacitor plate layer;
   forming upon the first capacitor plate layer a capacitor dielectric layer; and
   forming upon the capacitor dielectric layer a second capacitor plate layer, wherein:
   at least one of the first capacitor plate layer and the second capacitor plate layer is formed of a doped amorphous silicon material, where the doped amorphous silicon material is etched within an etchant solution consisting essentially of aqueous ammonium hydroxide.

6. A method for fabricating a dynamic random access memory cell structure comprising:
   providing a semiconductor substrate having formed therein a field effect transistor device;
   forming over the semiconductor substrate and electrically connected with a first source/drain region within the field effect transistor device a capacitor structure comprising:
   a first capacitor plate layer;
   a capacitor dielectric layer formed upon the first capacitor plate layer; and
   a second capacitor plate layer formed upon the capacitor dielectric layer, wherein:
   at least one of the first capacitor plate layer and the second capacitor plate layer is formed of a doped amorphous silicon material, where the doped amorphous silicon material is etched within an etchant solution comprising aqueous ammonium hydroxide, without hydrogen peroxide.

7. The method of claim 6 wherein the at least one of the first capacitor plate layer and the second capacitor plate layer is masked when it is formed incident to isotropic etching within the etchant solution comprising aqueous ammonium hydroxide, without hydrogen peroxide.

8. The method of claim 6 wherein the at least one of the first capacitor plate layer and the second capacitor plate layer is unmasked when it is formed incident to isotropic etching within the etchant solution comprising aqueous ammonium hydroxide, without hydrogen peroxide.

* * * * *